Oct. 14, 1969 J. M. WELTY 3,472,710

METHOD OF FORMING A FIELD EFFECT TRANSISTOR

Original Filed June 28, 1965

INVENTOR
JOSEPH M. WELTY

BY

Flehr and Swain

ATTORNEYS

United States Patent Office 3,472,710
Patented Oct. 14, 1969

3,472,710
METHOD OF FORMING A FIELD EFFECT TRANSISTOR

Joseph M. Welty, Los Altos Hills, Calif., assignor, by mesne assignments, to Teledyne, Inc., Hawthorne, Calif., a corporation of Delaware Continuation of application Ser. No. 467,269, June 28, 1965. This application Apr. 20, 1967, Ser. No. 632,452
Int. Cl. H01l 7/36
U.S. Cl. 148—175 2 Claims

ABSTRACT OF THE DISCLOSURE

A field effect transistor having a channel formed through a single aperture mask by double diffusion. Starting with a sandwich having p-type and n-type layers, an n-type region is diffused through the p layer into the n layer through the single aperture. Thereafter through the same window a second p-type inset region is diffused and the diffusion controlled to leave an n-type channel region remaining in the first inset region.

This application is a continuation of Ser. No. 467,269, filed June 28, 1965, now abandoned.

The present invention is directed to an improved field effect transistor and more particularly to a field effect transistor having a channel with accurately controlled dimensions, and a method of forming the same.

For high frequency operation of field effect transistors, the channel must be as thin and as short as possible. The formation of planar field effect transistors by double diffusion processes provides a relatively thin channel. However, as the channel is shortened, the source and drain connections become extremely close, thus reducing high voltage isolation. Furthermore, it is relatively difficult to make ohmic connection to the gate region.

The foregoing type of structure also has inherent extraneous electrical capacities reducing the high frequency response.

If a power device is desired, another problem with field effect transistors has been the low ratio of the volume of semiconductive material contained by the channel as compared to the over-all volume of the field effect device, making it impractical to provide adequate power handling capability while maintaining a miniaturized size.

It is a general object of the present invention to provide an improved field effect transistor and method of forming the same.

It is another object of the present invention to provide a high frequency field effect transistor and method of forming the same.

It is a further object of this invention to provide a field effect transistor having improved power handling and high voltage capabilities.

It is another object of the invention to provide a field effect transistor in which the channel length and thickness is determined entirely by diffusion.

It is yet another object of the invention to provide a field effect transistor having a high packing density and a method for achieving the same.

These and other objects of the invention will become more clearly apparent from the following description taken in connection with the accompanying drawings.

Referring to the drawings.

Figure 2:
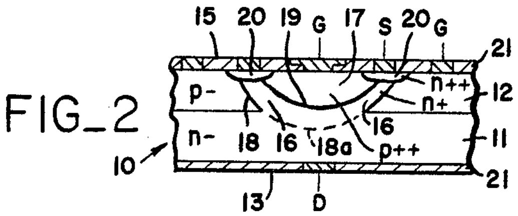
FIGURE 2 is a cross-sectional view taken along line 2—2 of FIGURE 1.
Figure 1:
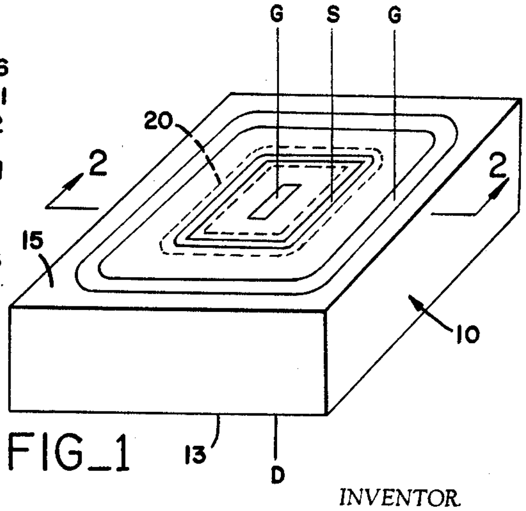
FIGURE 1 is a perspective view of a device in accordance with the present invention.

FIGURES 1 and 2 show a device in accordance with the invention, while FIGURES 3 through 14 are views of a portion of a wafer which might include a large number of devices. The wafer is then diced to form individual devices of the type shown in FIGURES 1 and 2.

As best seen in FIGURES 1 and 2, the field effect transistor of the present invention includes a wafer 10 which consists of a first layer 11 of one conductivity type and a second layer 12 of the opposite conductivity type. The second layer is contiguous with the first layer and forms a rectifying junction therewith. As will presently become apparent, the second layer may be formed by any well known method such as diffusion or epitaxial growth. The wafer 10 has two major faces 13 and 15.

Inset into the wafer from the face 15 are zones of semiconductive material. These zones form the operating regions of the device. The device includes a region 16 of one conductivity type inset into layer 12 from major face 15 to form rectifying junction 18 with the layer 12. This region is contiguous with layer 11 and extends into it as illustrated by the dashed lines 18*a*. A region 17 of opposite conductivity type is inset into region 16 to form a rectifying junction 19. The junctions 18 and 19 define a channel. The length of the channel is determined primarily by the thickness of the layer 12. A source connection S is made to the channel at upper face 15 and a drain connection D at lower face 13. The source connection may be coupled to the channel zone by an inset region 20 which has a high impurity concentration of the same type as the channel. The source and drain connections are, therefore, disposed on opposite sides of the wafer. Ohmic gate connections G are provided on face 15 at inset region 17 and layer 12. The remaining surface area of the transistor to which the ends of the junctions extend are protected by oxide layer 21.

Still referring to the device as shown in FIGURES 1 and 2, the wafer 10 may be formed of low impurity concentration layers designated n- for layer 11 and p- for layer 12. Preferably, inset regions 16 and 17 have high impurity concentrations designated n+ and p++, respectively, in order to provide for a more abrupt gate junction. Connecting layer 20 on top of channel 18 is of high impurity n++ material in order to provide a good source connection.

It is seen from the configuration of the field effect transistor of the present invention that the channel is substantially vertically disposed as compared to the horizontal channel configuration of the prior art. The vertical channel arrangement allows the drain connection to be on a face opposite to that of the source, thus isolating the two and preventing high voltage breakdown. Furthermore, with the drain contact being on the lower face 13, face area is reduced to provide greater packing density of the device as it is being processed in its undiced format. It is also noted that the thickness of the channel is controlled by the depth of diffusion of region 17 into inset region 16. The thickness of layer 12 controls substantially the length of the channel.

A greater power handling capability is also provided by the vertical type channel since the channel volume for the relative size of the wafer 10 is much higher than for ordinary type transistors of the field effect configuration. For example, in FIGURE 1, the rectangularly shaped source connection illustrates the relatively large volume occupied by the channel zone.

Figure 3:
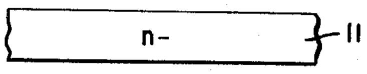
FIGURES 3 through 14 are partial views showing the steps in the process of making devices of the type shown in FIGURES 1 and 2.
Figure 4:
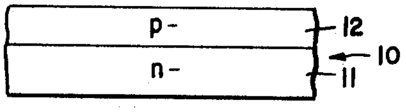
Figure 5:
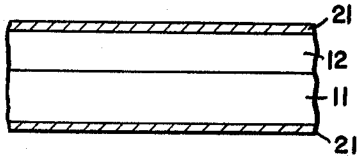

Referring now more particularly to FIGURES 3 through 14, the steps of forming a device in accordance with the invention are illustrated. Initially, a layer 11 which may be of n-semiconductive material, FIGURE 3, has grown on it an epitaxial layer 12, as shown in FIGURE 4, of semiconductive material of p-type conductivity, to form wafer 10. The wafer is exposed to an oxidizing atmosphere at an elevated temperature to form an oxide layer 21 on its surfaces. For example, the oxide layer may be formed by placing the wafer in a suitable oven in an oxygen-rich atmosphere at an elevated temperature, say 1000° C.

Figure 6:
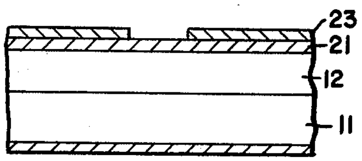
Figure 7:
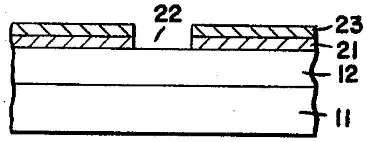
Figure 8:
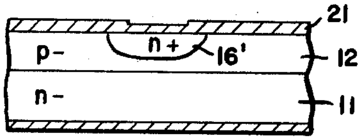

Region 16, which forms one of the junction boundaries of the channel, is inset into layer 12 as illustrated in FIGURES 6, 7, and 8, by diffusion through a window 22 formed in oxide layer 21. In preparation for this step, a photoresist 23 is applied to oxide layer 21 as shown in FIGURE 6 and thereafter masked, exposed to light, and etched to form window 22, as shown in FIGURE 7.

The wafer is then placed in an atmosphere containing donor impurities, such as a phosphorous atmosphere, at a low temperature at approximately 900° C., whereby a layer of donor impurities is predeposited on the exposed surface of the wafer. These impurities serve as a source of atoms for subsequent diffusion inwardly into the p-type wafer to form the region 16′ as shown in FIGURE 8. The prime designation is used since the region is only partially diffused.

Figure 9:
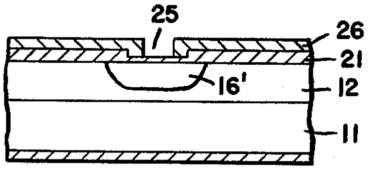
Figure 10:
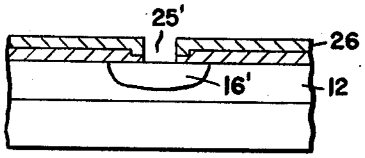
Figure 11:
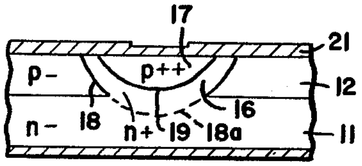

Region 17, as shown in FIGURE 2, is formed as an inset in region 16 by the steps illustrated in FIGURES 9 through 11. A window 25 is formed, as shown in FIGURE 9 in photoresist 26, by the process described above. Subsequent etching forms a window 25′ above the exposed surface of region 16′ in the same area of the wafer surface as the original deposition was carried out.

A predeposition of acceptor impurities, such as boron, on the wafer surface exposed by the window and a subsequent elevation of temperature serve to diffuse impurities inwardly to form region 17 as illustrated in FIGURE 11. Such temperature elevation also causes zone 16′ to enlarge to its full size and merge into wafer layer 11, as shown by the dashed outline 18*a* of the region.

The impurity concentration is controlled so that region 17 will have a high p++ concentration. The extent of diffusion is also controlled so that, as illustrated in FIGURE 11, a channel of predetermined width is formed between junctions 18 and 19. Thus, it is apparent that the channel thickness is determined primarily by the two diffusions of zones 16 and 17. The thickness of layer 12 determines the length of the channel.

Figure 12:
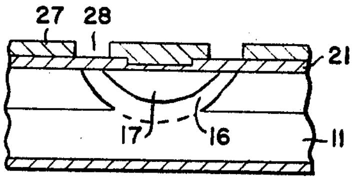
Figure 13:
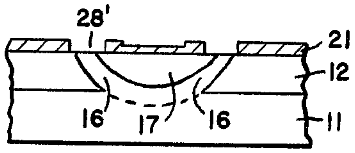
Figure 14:
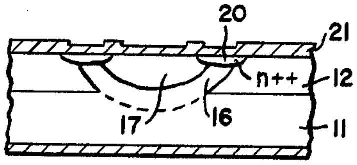

Low resistivity connection zone 20 for the channel is formed by providing a mask 27 having a window 28, shown in FIGURE 12, over the channel zone; etching of the oxide layer 21 to form a window 28′, shown in FIGURE 13, exposes the surface of the channel. Finally, donor type material is predeposited and diffused to form zone 20.

The final step in making the device is to apply photoresist and open windows through the oxide in both faces of the wafer for making ohmic source, drain, and gate connections to the various zones. This is not shown since it is well known in the art.

From the foregoing it is apparent that the present invention provides an improved field effect transistor and a method of making the same in which the thickness and length of a channel is accurately controlled and which produces a device which has an improved power handling and high voltage capability as well as greater packing density. Improved high frequency response is also achieved since the more compact construction reduces stray capacities.

I claim:

1. A process for forming a field effect transistor including the following steps: providing a semiconductive substrate layer of one conductivity type, providing a second layer of the opposite conductivity type contiguous with such substrate layer, diffusing into said second layer, in a selected area, impurities to form a first region of said one conductivity type which extends through said second layer to said substrate layer, thereafter diffusing in said above selected area impurities to form a region of said opposite conductivity type, said diffusion being controlled so that the depth of diffusion is less than said previous diffusion step whereby a channel is formed of said one conductivity type between barriers of said opposite conductivity type, providing source and drain electrode connections for said channel and substrate layer including providing a drain connection to said substrate layer and providing an inset region, of the same conductivity type as said channel, in said channel for said source connection, and providing gate electrode connections for said layer and region of opposite conductivity type.

2. A process as in claim 1 in which said second layer is epitaxially formed on said substrate layer.

References Cited

UNITED STATES PATENTS 3,246,214 4/1966 Hugle ............ 317—235

PAUL M. COHEN, Primary Examiner

U.S. Cl. X.R.

29—577, 578; 148—1.5, 187; 317—235